US011847019B2

(12) United States Patent
Niu et al.

(10) Patent No.: US 11,847,019 B2
(45) Date of Patent: Dec. 19, 2023

(54) POLAR CODE CONSTRUCTION METHOD AND APPARATUS

(71) Applicant: Beijing University of Posts and Telecommunications, Beijing (CN)

(72) Inventors: Kai Niu, Beijing (CN); Yan Li, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 0 days.

(21) Appl. No.: 17/442,830

(22) PCT Filed: Oct. 23, 2020

(86) PCT No.: PCT/CN2020/123329
§ 371 (c)(1),
(2) Date: Sep. 24, 2021

(87) PCT Pub. No.: WO2021/078273
PCT Pub. Date: Apr. 29, 2021

(65) Prior Publication Data
US 2022/0237076 A1    Jul. 28, 2022

(30) Foreign Application Priority Data
Oct. 25, 2019 (CN) .......................... 201911025757.5

(51) Int. Cl.
*H03M 13/00* (2006.01)
*G06F 11/08* (2006.01)
(Continued)

(52) U.S. Cl.
CPC .......... *G06F 11/085* (2013.01); *G06F 11/004* (2013.01); *H03M 13/13* (2013.01)

(58) Field of Classification Search
CPC ........ H03M 13/13; G06F 11/85; G06F 11/004
See application file for complete search history.

(56) References Cited

U.S. PATENT DOCUMENTS

| 7,551,671 B2 | 6/2009 | Tyldesley et al. |
| 8,155,230 B2 * | 4/2012 | Ktenas ..................... H04L 5/026 370/335 |

(Continued)

FOREIGN PATENT DOCUMENTS

| CN | 105897279 A | 8/2016 |
| CN | 106130687 A | 11/2016 |

(Continued)

OTHER PUBLICATIONS

Niu, Kai, et al.,"Polar Codes for Fast Fading Channel: Design Based on Polar Spectrum", IEEE Transactions on Vehicular Technology, vol. 69, No. 9, Oct. 7, 2020, ISSN: 0018-9545, p. 4, right-hand column, line 1 to p. 7, left-hand column, line 3.

(Continued)

*Primary Examiner* — Esaw T Abraham
(74) *Attorney, Agent, or Firm* — Burr & Forman LLP

(57) ABSTRACT

The embodiments of the present application provide a polar code construction method and apparatus, which relate to the field of communications technology. The method comprises: obtaining a polar weight spectrum for each polarized channel; calculating an upper bound of error probability of each polarized channel based on the obtained polar weight spectrum, distribution probability density of a fading factor of a fading channel, and a signal-to-noise ratio of the fading channel; taking a logarithm of the calculated upper bound of the error probability for each polarized channel and obtaining a reliability metric of the polarized channel based on the taken logarithm, wherein the smaller the metric value is, the higher the reliability of the polarized channel is; sorting all polarized channels in an ascending order of the reliability metric and selecting part of the polarized channels having a lowest reliability metric for transmitting information bits and the remaining polarized channels for transmitting frozen bits. According to the embodiments of the present applica- (Continued)

tion, performing polar code construction under the condition of a fading channel can improve the efficiency of polar code construction.

9 Claims, 2 Drawing Sheets

(51) Int. Cl.
*G06F 11/00* (2006.01)
*H03M 13/13* (2006.01)

(56) References Cited

U.S. PATENT DOCUMENTS

| | | | | |
|---|---|---|---|---|
| 9,504,042 | B2* | 11/2016 | El-Khamy | H03M 13/13 |
| 10,581,556 | B1* | 3/2020 | Dizdar | H04L 1/0625 |
| 10,651,972 | B2* | 5/2020 | Wang | H04L 1/0041 |
| 10,833,705 | B2* | 11/2020 | Jiang | H03M 13/136 |
| 10,855,311 | B2* | 12/2020 | Gresset | H03M 13/2957 |
| 10,862,625 | B2* | 12/2020 | Yang | H03M 13/13 |
| 10,873,345 | B2* | 12/2020 | Yang | H03M 13/1137 |
| 10,879,932 | B2* | 12/2020 | Liu | H03M 13/2906 |
| 11,057,151 | B2* | 7/2021 | Yang | H04L 1/0041 |
| 2017/0222757 | A1 | 8/2017 | Huang et al. | |

FOREIGN PATENT DOCUMENTS

| | | |
|---|---|---|
| CN | 109286468 A | 1/2019 |
| CN | 109361495 A | 2/2019 |
| CN | 109672497 A | 4/2019 |
| CN | 110261856 A | 9/2019 |
| CN | 110708079 A | 1/2020 |
| KR | 20100068192 A | 6/2010 |
| KR | 20120139308 A | 12/2012 |
| WO | 2017196203 A1 | 11/2017 |

OTHER PUBLICATIONS

Yu, Qing Ping, et al., "Polar Codes Construction for Fading Channels", 2018 18th IEEE International Conference on Communication Technology, Dec. 31, 2018, entire document.

Chao Gao, et al., "High Performance PAM Transmission Aided by Polar Code", 2019, all pages cited.

Yingxian Zhang, et al., "A Practical Construction Method for Polar Codes", 2014, IEEE Communications Letters, vol. 18, No. 11, Nov. 2014, all pages cited.

* cited by examiner

US 11,847,019 B2

POLAR CODE CONSTRUCTION METHOD AND APPARATUS

The present application claims the priority to a Chinese patent application No. 201911025757.5, filed with the China National Intellectual Property Administration on Oct. 25, 2019 and entitled "POLAR CODE CONSTRUCTION METHOD AND APPARATUS", which is incorporated herein by reference in its entirety.

TECHNICAL FIELD

This application relates to the field of communications technology, and in particular to a polar code construction method and apparatus.

BACKGROUND

In the field of communication technology, due to the noise interference in the information transmission channels, it is necessary to perform polarization process on the channels to obtain polarized channels. Among the obtained polarized channels, some of the polarized channels tend to be noiseless channels, and the others tend to be full-noise channels, and then information transmission is realized through the polarized channels. When transmitting information through the polarized channels, polarized channels for transmitting information bits and polarized channels for transmitting frozen bits are determined. The information bits are information that is randomly sent by an information sending end with equal probability and need to be decoded and determined by an information receiving end. The frozen bits are fixed information known by the information sending end and the information receiving end. According to the determined polarized channels, information to be transmitted is encoded to obtain an encoding result, the information to be transmitted is transmitted through the actual channels in the communication system. The process of determining the polarized channels for transmitting information bits mainly comprises selecting, from all the polarized channels, polarized channels that tend to be noiseless for transmitting the information bits and the remaining polarized channels for transmitting the frozen bits.

The more the polarized channels tend to be noiseless, the lower the probability of errors during transmitting information, and thus the higher the reliability of the polarized channels. Based on this, in the prior art, polarized channels are generally selected for transmitting information bits based on the reliabilities of the polarized channels.

Specifically, Gaussian Approximation (GA) algorithm may be used to calculate the reliability of each polarized channel. When the GA algorithm is used to calculate the reliability of each polarized channel obtained by performing polarization process on a fading channel, an average channel capacity is generally obtained by traversing fading factors, and then an equivalent noise variance is calculated based on the average channel capacity under the condition of Binary Additive White Gaussian Noise Channel (BAWGNC), and the reliability of the polarized channel is calculated based on the equivalent noise variance using the GA algorithm.

However, when the channel condition of the fading channel changes, for example, the signal-to-noise ratio (SNR) changes, it is necessary to re-traverse the fading factors to obtain the average channel capacity, and then recalculate the reliability of the polarized channel. In addition, due to the high complexity of the GA algorithm, it is inefficient to calculate the reliability of each polarized channel obtained by performing the polarization process on the fading channel using the GA algorithm. Since the reliability calculation of polarized channels is crucial for the construction of the polar code, the calculation efficiency of the existing polarized channel reliability calculation method is low, which will also lead to a low efficiency in polar code construction.

SUMMARY

The object of the embodiments of the present application is to provide a polar code construction method and apparatus to solve the problem of low efficiency in calculating the polarized channel reliability using the GA algorithm during the polar code construction under the condition of fading channels. The specific technical solutions are as follows.

In a first aspect, an embodiment of the present application provides a polar code construction method, comprising:
  obtaining a polar weight spectrum based on a code length of information to be transmitted;
  calculating an upper bound of error probability of each polarized channel based on the obtained polar weight spectrum, distribution probability density of a fading factor of a fading channel, and a signal-to-noise ratio of the fading channel;
  taking a logarithm of the calculated upper bound of the error probability for each polarized channel and obtaining a reliability metric of the polarized channel based on the taken logarithm, wherein the smaller a value of the metric is, the higher a reliability of the polarized channel is;
  sorting all polarized channels in an ascending order of the reliability metric and selecting part of the polarized channels having a lowest reliability metric for transmitting information bits and remaining polarized channels for transmitting frozen bits.

In an embodiment of the present application, obtaining the polar weight spectrum for each polarized channel comprises:
  obtaining a polar weight spectrum for a polar code of a code length N by enumerating codewords;
  and/or
  obtaining a weight spectrum for a polar code of a code length N by enumerating codewords, and obtaining a weight spectrum for a polarized channel located on a lower half of a generator matrix of a polar code of a code length 2N based on a relationship between the generator matrix of the polar code of a code length 2N and a generator matrix of the polar code of a code length N; calculating a complete polar weight spectrum for the polar code of a code length 2N based on a Mac-Williams identity in a form of a matrix, and a relationship between the weight spectrum and the polar weight spectrum.

In an embodiment of the present application, taking the logarithm of the calculated upper bound of the error probability for each polarized channel and obtaining the reliability metric of the polarized channel based on the taken logarithm, comprises:
  taking the logarithm of the calculated upper bound of the error probability for each polarized channel, and performing Jacobian transformation on the taken logarithm to obtain a transformation result as the reliability metric of the polarized channel; or
  when the signal-to-noise ratio is higher than a preset threshold, taking a logarithm of a first probability for each polarized channel, and taking the taken logarithm as the reliability metric of the polarized channel, wherein the first probability is an approximate upper bound of the error probability of the polarized channel when only a minimum non-zero codeword weight is considered.

In an embodiment of the present application, the signal-to-noise ratio is a preset fixed value.

In a second aspect, an embodiment of the present application provides a polar code construction apparatus, comprising:

a polar weight spectrum obtaining module configured for obtaining a polar weight spectrum based on a code length of information to be transmitted;

an error probability calculating module configured for calculating an upper bound of error probability of each polarized channel based on the obtained polar weight spectrum, distribution probability density of a fading factor of a fading channel, and a signal-to-noise ratio of the fading channel;

a reliability obtaining module configured for taking a logarithm of the calculated upper bound of the error probability for each polarized channel and obtaining a reliability metric of the polarized channel based on the taken logarithm, wherein the smaller a value of the metric is, the higher a reliability of the polarized channel is;

a channel selecting module configured for sorting all polarized channels in an ascending order of the reliability metric and selecting part of the polarized channels having a lowest reliability metric for transmitting information bits and remaining polarized channels for transmitting frozen bits.

In an embodiment of the present application, the polar weight spectrum obtaining module comprises:

a first polar weight spectrum obtaining unit, configured for obtaining a polar weight spectrum for a polar code of a code length N by enumerating codewords;

and/or a second polar weight spectrum obtaining unit, configured for obtaining a weight spectrum for a polar code of a code length N by enumerating codewords, and obtaining a weight spectrum for a polarized channel located on a lower half of a generator matrix of a polar code of a code length 2N based on a relationship between the generator matrix of the polar code of a code length 2N and a generator matrix of the polar code of a code length N; calculating a complete polar weight spectrum for the polar code of a code length 2N based on a Mac-Williams identity in a form of a matrix, and a relationship between the weight spectrum and the polar weight spectrum.

In an embodiment of the present application, the reliability obtaining module is specifically configured for:

taking the logarithm of the calculated upper bound of the error probability for each polarized channel, and performing Jacobian transformation on the taken logarithm to obtain a transformation result as the reliability metric of the polarized channel; or when the signal-to-noise ratio is higher than a preset threshold, taking a logarithm of a first probability for each polarized channel, and taking the taken logarithm as the reliability metric of the polarized channel, wherein the first probability is an approximate upper bound of the error probability of the polarized channel when only a minimum non-zero codeword weight is considered.

In an embodiment of the present application, the signal-to-noise ratio is a preset fixed value.

In a third aspect, an embodiment of the present application provides an electronic device, comprising a processor, a communication interface, a memory, and a communication bus, wherein the processor, the communication interface and the memory communicate with each other through the communication bus;

the memory is configured for storing computer programs;

the processor is configured for implementing steps of the method in the first aspect when executing the computer programs stored in the memory.

In a fourth aspect, an embodiment of the present application provides a computer-readable storage medium, having stored thereon computer programs which, upon executed by a processor, cause the implementation of steps in the methods of the first aspect.

As can be seen, when the polar code is constructed using the method according to the embodiment of the present application under the condition of the fading channels, the upper bound of the error probability of each polarized channel is calculated by obtaining the polar weight spectrum for the polarized channel in conjunction with the distribution probability density of the fading factor of the fading channel and the signal-to-noise ratio of the fading channel, and then the logarithm of the upper bound of the error probability is taken, and then the reliability metric of each polarized channel is obtained based on the taken logarithm, and part of polarized channels with the lowest reliability metric are selected for transmitting information bits. The polar weight spectrum for each polar code of a code length may be calculated offline, and the reliability metric of the polarized channel is calculated based on the metric formula after the code length and the code rate are given. Thus, the efficiency of polar code construction is improved compared with the iterative calculation in the prior art.

Obviously, any product or method implementing the present application does not necessarily need to achieve all the advantages described above simultaneously.

BRIEF DESCRIPTION OF THE DRAWINGS

In order to more clearly describe the technical solutions of the embodiments of the present application or of the prior art, drawings that need to be used in embodiments and the prior art will be briefly described below. Obviously, the drawings described below are only some embodiments of the present application, and those skilled in the art may also obtain other drawings based on these drawings.

DETAILED DESCRIPTION

The present application is further described in detail below with reference to the appended drawings and embodiments, for the purpose of clarifying the objects, technical solutions and advantages of the present application. Obviously, the described embodiments are only some, and not all, of the embodiments of the present application. All other embodiments obtained based on the embodiments of the present application by those skilled in the art fall into the scope of protection defined by the present application.

The embodiments of the present application provide a polar code construction method in the art fall into the scope of protection defined by the present application.

The embodiments of the present application provide a polar code construction method and apparatus, which will be described in detail below.

Figure 1:
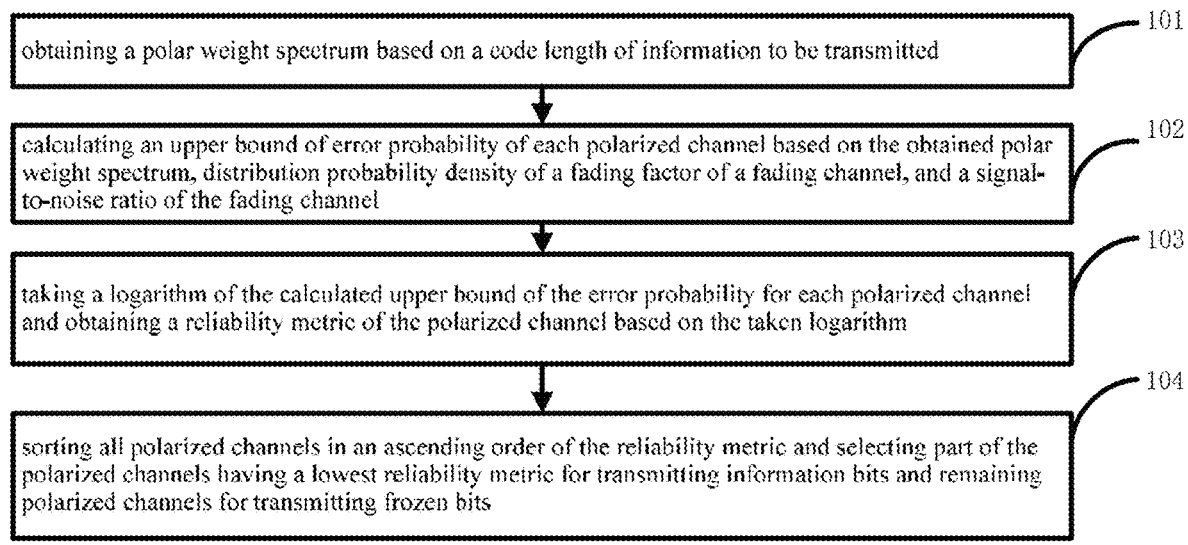
FIG. 1 is a schematic flowchart of a polar code construction method according to an embodiment of the present application.

As shown in FIG. 1, FIG. 1 is a schematic flowchart of a polar code construction method according to an embodiment of the present application. The method includes the following steps.

At step 101, a polar weight spectrum is obtained based on a code length of information to be transmitted.

In the embodiment of this application, the code length of the information to be transmitted may also be understood as the code length of a polar code. The information to be transmitted needs to be encoded before it can be transmitted in a channel. When the information to be transmitted has a code length of N, that is, when the code length of the polar code is N, it corresponds to N polarized channels, in which each polarized channel corresponds to one linear block code. The linear block code is represented by (N, K), wherein N is the code length and K is an information bit length, wherein K=N−i+1, and i represents the index of the polarized channel. For example, when there are N polarized channels, the index i may be 1, 2, 3, ..., N.

The linear block code corresponding to the i-th polarized channel is (N, N−i+1), so the linear block code (N, N−i+1) contains $2^{N-i+1}$ codewords, the weight spectrum may be obtained based on the weight of $2^{N-i+1}$ codewords contained in the i-th polarized channel.

An example of obtaining the weight spectrum for the codewords contained in the linear block code corresponding to each polarized channel is given below.

In the embodiment of the present application, the generator matrix of the polar code has been determined and is only related to the code length N.

For example, the generator matrix of the polar code with a code length $N=2^n$ is represented by $F_N$, then $F_N=F_3^{\otimes n}$, wherein $$F_2 = \begin{bmatrix} 1 & 0 \\ 1 & 1 \end{bmatrix}$$

is the kernel matrix of the polar code, and the arithmetic symbol ⊗n represents the n-order Kronecker product of the kernel matrix.

Regarding the Kronecker product:

$$F_2^{\otimes 1} = F_2 = \begin{bmatrix} 1 & 0 \\ 1 & 1 \end{bmatrix};$$

$$F_2^{\otimes 2} = F_4 = \begin{bmatrix} F_2 & 0 \\ F_2 & F_2 \end{bmatrix} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

and so forth.

For example, there is a 4*4 generator matrix and a 4-bit information symbol sequence, wherein the information symbol sequence is a random sequence. Each row of the generator matrix corresponds to one polarized channel, from top to bottom, the first row of the matrix corresponds to the polarized channel with index 1, the second row corresponds to the polarized channel with index 2, the third row corresponds to the polarized channel with index 3, and the fourth row corresponds to the polarized channel with index 4.

For the polarized channel with index 4, since its corresponding linear block code only uses the fourth row of the generator matrix, the codeword weight of the linear block code is only related to the fourth row of the generator matrix. Therefore, by fixing the first three bits of the 4-bit information symbol sequence to 0, only the fourth bit may be randomly taken as 0 or 1 with equal probability, then 2 codewords are obtained. The number of 1 contained in each codeword is the codeword weight.

For the polarized channel with index 3, since its corresponding linear block code uses the third and fourth rows of the generator matrix, the codeword weight of the linear block code is only related to the third and fourth rows of the generator matrix. Therefore, by fixing the first two bits of the 4-bit information symbol sequence to 0, only the third and fourth bits may be randomly taken as 0 or 1 with equal probability, then 4 codewords are obtained. The number of 1 contained in each codeword is the codeword weight.

For the polarized channel with index 2, since its corresponding linear block code uses the second, third, and fourth rows of the generator matrix, the codeword weight of the linear block code is related to the second, third, and fourth rows of the generator matrix. Therefore, by fixing the first bit of the 4-bit information symbol sequence to 0, only the second, third, and fourth bits may be randomly taken as 0 or 1 with equal probability, then 8 codewords are obtained. The number of 1 contained in each codeword is the codeword weight.

For the polarized channel with index 1, since its corresponding linear block code uses all rows of the generator matrix, any bit of the 4-bit information symbol sequence may be randomly taken as 0 or 1 with equal probability, then 16 codewords are obtained. The number of 1 contained in each codeword is the codeword weight.

On this basis, the polar weight spectrum is defined as $A_N^{(i)}(j)$, i=1, 2, ..., N, j=0, 1, ..., N, $A_n^{(i)}(j)$ represents the number of codewords with the codeword weight of j in the polarized channel with the index i, wherein i represents the index of the polarized channel, j represents the codeword weight, and N represents the total number of the polarized channels after encoding the information to be transmitted with a code length of N. The weight spectrum for the i-th polarized channel is expressed as $S_N^{(i)}(j)$, i=1, 2, ..., N, j=0, 1, ..., N, and the weight spectrum for the i-th polarized channel (when the codeword weight is not equal to 0) is actually obtained by cumulating the polar weight spectrums for the polarized channels with indices from i to N, and the number of codewords with codeword weight of 0 in each polarized channel is 1, that is, $$S_N^{(i)}(j) = \sum_{l=i}^{N} A_N^{(l)}(j)$$

$i = 1, 2, \ldots, N, j = 1, 2, \ldots, N, S_N^{(i)}(0) = 1, i = 1, 2, \ldots, N.$ In an embodiment of the present application, obtaining the polar weight spectrum for each polarized channel may be achieved in at least one of the following two methods.

In a first method, the polar weight spectrum for each polarized channel of a code length is obtained by enumerating codewords.

In a second method, for a target code length 2N, the polar weight spectrum for each polarized channel corresponding to the target code length 2N is calculated based on the pre-calculated polar weight spectrum for each polarized channel corresponding to the code length N, the Mac-Williams identity in the form of a matrix, and the relationship between the weight spectrum for the polarized channel and the polar weight spectrum for the polarized channel.

As an example, if the target code length is 64, and the polar weight spectrum for each polarized channel corresponding to code length 32 have been calculated in advance by enumerating codewords, then the polar weight spectrum for each polarized channel corresponding to code length 64 may be directly calculated based on the polar weight spectrum for each polarized channel corresponding to code length 32 and the above relationship.

As another example, the polar weight spectrum for each polarized channel corresponding to a shorter code length for example code length 8 may be first calculated by enumerating codewords, then the polar weight spectrum for each polarized channel corresponding to code length 16, code length 32, code length 64 and code length 128 may be sequentially and recursively calculated based on the above relationship.

The above two methods are further described below.

In the first method, the polar weight spectrum for each polarized channel is obtained by enumerating codewords.

For example, there is a 4*4 generator matrix and a 4-bit information symbol sequence. Each row of the matrix corresponds to one polarized channel, from top to bottom, the first row of the matrix corresponds to the polarized channel with index 1, the second row corresponds to the polarized channel with index 2, the third row corresponds to the polarized channel with index 3, and the fourth row corresponds to the polarized channel with index 4.

For the polarized channel with index 4, since its corresponding linear block code only uses the fourth row of the generator matrix, by fixing the first three bits of the 4-bit information symbol sequence to 0, only the fourth bit may be taken as 1, then 1 codeword is obtained. The number of 1 contained in each codeword is the codeword weight.

For the polarized channel with index 3, since its corresponding linear block code uses the third and fourth rows of the generator matrix, by fixing the first two bits of the 4-bit information symbol sequence to 0 and taking the third bit as 1, the fourth bit may be randomly taken as 0 or 1 with equal probability, then 2 codewords are obtained. The number of 1 contained in each codeword is the codeword weight.

For the polarized channel with index 2, since its corresponding linear block code uses the second, third, and fourth rows of the generator matrix, by fixing the first bit of the 4-bit information symbol sequence to 0 and taking the second bit as 1, the third and fourth bits may be randomly taken as 0 or 1 with equal probability, then 4 codewords are obtained. The number of 1 contained in each codeword is the codeword weight.

For the polarized channel with index 1, since its corresponding linear block code uses all rows of the generator matrix, by fixing the first bit to 1, the remaining three bits may be randomly taken as 0 or 1 with equal probability, then 8 codewords are obtained. The number of 1 contained in each codeword is the codeword weight.

It can be seen that the polar weight spectrum for each polarized channel corresponding to a specific code length may be calculated by enumerating codewords.

In the second method, the weight spectrum for the polar code of a code length N is obtained by enumerating codewords, and the polar weight spectrum for each polarized channel corresponding to code length 2N is calculated by using a Mac-Williams identity in the form of a matrix and the relationship between the weight spectrum for the polarized channel and the polar weight spectrum for the polarized channel.

Specifically, assuming that a first code length is N, the weight spectrum and the polar weight spectrum for the polar code of a code length N are obtained through the first method. Assuming that there is a polarized channel that corresponds to a given (N,K) linear block code C, the weight spectrum for the given linear block code is $A_j$, the corresponding dual code $C^\perp$ for the given linear block code is a (N, N−K) linear block code, and the weight spectrum for the dual code is $B_j$, wherein K represents the length of information bits, which then is transformed into a codeword of length N through an encoder, then the weight spectrums for a pair of dual codes satisfy the following Mac-Williams identity:

$$\sum_{j=0}^{N}\binom{N-j}{i}A_j = q^{K-i}\sum_{j=0}^{N}\binom{N-j}{N-i}B_j.$$

By defining a binomial distribution coefficient matrix $$C_N = \left[\binom{N-j}{i}\right]_{0\le i,j \le N},$$

a dual coefficient matrix $$D_N = \left[\binom{N-j}{N-i}\right]_{0\le i,j \le N},$$

and a diagonal matrix $\Delta_N=\mathrm{diag}(q^{N-i})_{0\le i\le N}$ respectively, the Mac-Williams identity in the form of a matrix is obtained:

$$C_N A = q^{K-N}\Delta_N D_N B.$$

wherein, q represents the code base number, $A=(A_0, A_1, \ldots, A_N)$ is the weight distribution vector of the original code, and $B=(B_0, B_1, \ldots, B_N)$ is the weight distribution vector of the dual code. Assuming that the inverse matrix of the coefficient matrix $C_N$ is $C_N^{-1}$, both sides of the above equation are multiplied with $C_N^{-1}$ to obtain the solution of the weight spectrum in the form of a matrix:

$$A = q^{K-N}C_N^{-1}\Delta_N D_N B,$$
$$q^{K-N}K_N B$$

wherein, $K_N$ is the Krawtchouk matrix, the dimension thereof is $(N+1)\times(N+1)$, and each element thereof is specifically defined as follows:

$$K_N = \left[\sum_{m_0=0}^{i} (-1)^{m_0}, (q-1)^{i-m_0} \binom{j}{m_0}\binom{N-j}{i-m_0}\right],$$

wherein, $0 \leq i, j \leq N$.

For the polarized channel with index i, its corresponding linear block code is C(N, N−i+1), assuming that its weight distribution vector is expressed as $U_N^{(i)} = (U_N^{(i)}(0), U_N^{(i)}(1), \ldots, U_N^{(i)}(N))$, the dual polarized channel for the polarized channel with index i has an index N−i+2, and the weight distribution vector of the corresponding dual code (N, i−1) is expressed as $V_N^{(N+2-i)}$. Any element corresponding to non-zero code weight in the vector $U_N^{(i)}$ may be obtained by cumulating the polar weight spectrums for the polarized channels with indices from i to N, that is $$U_N^{(i)}(j) = \sum_{l=i}^{N} A_N^{(l)}(j), j = 1, 2, \ldots, N$$

and $U_N^{(i)}(0) = 1$. The following relationship is obtained:
$U_N^{(i)} = 2^{K_1-N} K_N V_N^{(N+2-i)}$, $2 \leq i \leq N/2$, wherein $K_1 = N-i+1$, i.e., $K_1$ represents the information bit length of the linear block code corresponding to the polarized channel with index i.

Based on the above expression, the polar weight spectrum for the polar code of a code length 2N is now calculated. When the information to be transmitted is encoded with a second code length 2N, assuming that the polar weight spectrum for the l-th polarized channel is $A_{2N}^{(l)}(p)$, l=1, 2, ..., 2N, p=0, 1, 2, ..., 2N, the weight spectrum is $U_{2N}^{(l)}(p)$, l=1, 2, ..., 2N, p=0, 1, 2, ..., 2N, wherein p represents the codeword weight.

If the index of the polarized channel is $N+1 \leq l \leq 2N$, the recurrence relationship between the generator matrix $F_{2N}$ of code length 2N and the generator matrix $F_N$ of code length N is known as:

$$F_{2N} = \begin{bmatrix} F_N & 0 \\ F_N & F_N \end{bmatrix}.$$

According to the structure of $F_{2N}$, the polarized channels at this time are located in the lower half of the generator matrix $F_{2N}$, which are composed of duplicate partial row vectors of two same generator matrix $F_N$, so the weight spectrum and the polar weight spectrum corresponding to code length 2N may be obtained directly from the weight spectrum and the polar weight spectrum corresponding to code length N through the following recurrence relationship:

$$\begin{cases} A_{2N}^{(l)}(p) = A_N^{(i)}(j) \\ U_{2N}^{(l)}(p) = U_N^{(i)}(j) \end{cases}, i = 1, 2, \ldots, N, l = i+N, p = 2j.$$

If the channel index is $2 \leq l \leq N$, according to the structure of the matrix $F_{2N}$, the polarized channels at this time are located in the upper half of the matrix $F_{2N}$, which are composed of partial row vectors of the matrix $F_N$. The polarized channel with the index 1 corresponds to the linear block code (2N, 2N−l+1), the weight spectrum for the linear block code is set to $V_{2N}^{(l)}(p)$, and the weight spectrum $U_{2N}^{(2N+2-l)}(p)$ for the dual code (2N, l−1) is obtained. Therefore, according to the McWilliams identity in the form of a matrix $$U_N^{(i)} = 2^{K-N} K_N V_N^{(N+2+i)}, 2 \leq i \leq \frac{N}{2},$$

wherein, K=N−i+1, the weight distribution vector $V_{2N}^{(l)} = 2^{1-l} K_{2N} U_{2N}^{(2N+2-l)}$, $2 \leq l \leq N$ composed of $V_{2N}^{(l)}(p)$ may be directly obtained. According to the relationship between the weight spectrum for the polarized channel and the polar weight spectrum for the polarized channel, the polar weight spectrum $A_{2N}^{(l)}(p) = V_{2N}^{(l)}(p) - V_{2N}^{(l+1)}(p)$ is calculated for the polarized channel with index l=2, 3, ..., N.

So far, only the polar weight spectrum for the polarized channel with l=1 is unknown. In fact, after the polar weight spectrums for the 2N−1 polarized channels with l=2, 3, ..., 2N are accumulated, the polar weight spectrum for the first subchannel may be obtained after subtracting them from the binomial distribution, that is, $$A_{2N}^{(1)}(p) = \binom{2N}{p} - V_{2N}^{(2)}(p),$$

p=0, 1, ..., 2N. In this way, the polar weight spectrum for each polarized channel of the polar code of a code length 2N are obtained.

In practical applications, in addition to the polarized channel with l=1, when the codeword weight p is a positive odd number, the corresponding number of codewords is 0, which reduces the calculation amount by half. Further considering the symmetric relationship of the weight spectrum, $V_{2N}^{(l)}(p) = V_{2N}^{(l)}(2N-p)$ may be obtained, which further reduces the calculation amount by half, so the total calculation amount may be reduced by ¾.

At step 102, an upper bound of error probability of each polarized channel is calculated based on the obtained polar weight spectrum, distribution probability density of a fading factor of the fading channel, and a signal-to-noise ratio of the fading channel.

Specifically, the upper bound of the error probability of each polarized channel is calculated based on the obtained polar weight spectrum in conjunction with a probability distribution of the fading factor of the fading channel and the signal-to-noise ratio of the fading channel. According to the channel fading situation, the channels may be divided into a plurality of types, such as a fast fading channel, an overall block fading channel, and a general block fading channel and the like. Since the probability distribution of the fading factor is not the same for different fading channels, the upper bound results of the error probabilities are also different for the polarized channels. Therefore, for a fast fading channel, an overall block fading channel, and a general block fading channel, the upper bound of the error probability of each polarized channel is calculated based on the obtained polar weight spectrum, the distribution probability density of the fading factor of each fading channel, and the signal-to-noise ratio of each fading channel by means of a preset error probability formula corresponding to each fading channel.

The upper bound results of the error probabilities of the polarized channels calculated for three different types of fading channels are described below in detail.

The first type of fading channel is a fast fading channel. The fast fading channel includes a Rayleigh fast fading channel, a Rician fast fading channel, and a Nakagami-m fast fading channel.

Under the condition of the Rayleigh fast fading channel, the fading factors experienced by all transmission symbols in a frame are independent and obey the identical Rayleigh distribution. It is assumed that the error probability of the i-th polarized channel of a polar code of a code length N is expressed as $P(W_N^{(i)})$, wherein, $W_N^{(i)}$ represents the i-th polarized channel of the polar code of a code length N. The polar weight spectrum is expressed as $A_N^{(i)}(d)$, that is, the number of non-zero codewords with codeword weight d, the signal-to-noise ratio of the fading channel is $E_s/N_0$, wherein $E_s$ represents the average energy for transmitting a single symbol of a signal, $N_0$ represents the noise power spectral density, then the upper bound of the error probability of the polarized channel may be derived from the distribution probability density of the fading factor as shown below:

$$P(W_N^{(i)}) \le \frac{1}{2} \sum_{d=d_{min}^{(i)}}^{N} A_N^{(i)}(d)\left(1 + \frac{E_s}{N_0}\right)^{-d},$$

wherein $d_{min}^{(i)}$ represents the minimum value of the codeword weight in the polar weight spectrum corresponding to the i-th polarized channel.

Under the condition of the Rician fast fading channel, the fading factors experienced by all transmission symbols in a frame are independent and obey the identical Rician distribution. It is assumed that the error probability of the i-th polarized channel of the polar code with length N is expressed as $P(W_N^{(i)})$, the polar weight spectrum is expressed as $A_N^{(i)}(d)$, that is, the number of non-zero codewords with codeword weight d, the signal-to-noise ratio of the fading channel is $E_s/N_0$, wherein $E_s$ represents the average energy for transmitting a single symbol of a signal, $N_0$ represents the noise power spectral density, $K_{Rician}$ represents the power ratio of the direct path to the scattered path in the Rician channel, then the upper bound of the error probability of the polarized channel may be derived from the distribution probability density of the fading factor as shown below:

$$P(W_N^{(i)}) \le \frac{1}{2} \sum_{d=d_{min}^{(i)}}^{N} A_N^{(i)}(d) \left(\frac{1 + K_{Rician}}{1 + K_{rician} + \frac{E_s}{N_0}}\right)^d \exp\left(\frac{d\frac{E_s}{N_0} K_{Rician}}{1 + K_{rician} + \frac{E_s}{N_0}}\right),$$

wherein $d_{min}^{(i)}$ represents the minimum value of the codeword weight in the polar weight spectrum corresponding to the i-th polarized channel.

Under the condition of the Nakagami-m fast fading channel, the fading factors experienced by all transmission symbols in a frame are independent and obey the identical Nakagami-m distribution. It is assumed that the error probability of the i-th polarized channel of the polar code of a code length N is expressed as $P(W_N^{(i)})$, the polar weight spectrum is expressed as $A_N^{(i)}(d)$, that is, the number of non-zero codewords with codeword weight d, the signal-to-noise ratio of the fading channel is $E_s/N_0$, wherein $E_s$ represents the average energy for transmitting a single symbol of a signal, $N_0$ represents the noise power spectral density, m is a coefficient characterizing the fading strength of the Nakagami-m channel, then the upper bound of the error probability of the polarized channel may be derived from the distribution probability density of the fading factor as shown below:

$$P(W_N^{(i)}) \le \frac{1}{2} \sum_{d=d_{min}^{(i)}}^{N} A_N^{(i)}(d)\left(1 + \frac{E_s}{mN_0}\right)^{-md},$$

wherein $d_{min}^{(i)}$ represents the minimum value of the codeword weight in the polar weight spectrum corresponding to the i-th polarized channel.

The second type of fading channel is an overall block fading channel. Under the condition of the overall block fading channel, the fading factors experienced by all transmission symbols in a frame are the same and obey the Rayleigh distribution. It is assumed that the error probability of the i-th polarized channel of the polar code of a code length N is expressed as $P(W_N^{(i)})$, the polar weight spectrum is expressed as $A_N^{(i)}(d)$, that is, the number of non-zero codewords with codeword weight d, the signal-to-noise ratio of the fading channel is $E_s/N_0$, wherein $E_s$ represents the average energy for transmitting a single symbol of a signal, $N_0$ represents the noise power spectral density, then the upper bound of the error probability of the polarized channel may be derived from the distribution probability density of the fading factor as shown below:

$$P(W_N^{(i)}) \le \sum_{d=d_{min}^{(i)}}^{N} \frac{A_N^{(i)}(d)}{1 + d\frac{E_s}{N_0}}.$$

The third type of fading channel is a general block fading channel. Under the condition of the general block fading channel, the transmission symbols in a frame are divided into L (it theoretically may be any integer greater than 1) blocks, and all the transmission symbols in each sub-block experience the same fading factor, the fading factors among sub-blocks are independent from each other and obey the Rayleigh distribution. For the general block fading channel, there are two methods to obtain the upper bound of the error probability of the polarized channel.

The first method is based on a random mapping method. By introducing a random interleaver Π, the transmitted codeword bit sequence is randomly mapped to each sub-block, and then the random mapping distance spectrum is calculated to obtain the upper bound of the error probability of the polarized channel as shown below:

$$P(W_N^{(i)}) \le \sum_{d=d_{min}^{(i)}}^{N} \sum_{F=\lceil d/M \rceil}^{d} \sum_{f_1=0}^{F_1} \sum_{f_2=0}^{F_2} \cdots \sum_{f_w=0}^{F_w} A_N^{(i)}(d) P_d(f) \prod_{v=1}^{w}\left(\frac{1}{vE_s/N_0 + 1}\right)^{f_v}.$$

For convenience, it may be abbreviated as $$P(W_N^{(i)}) \le \sum_{d=d_{min}^{(i)}}^{N} \sum_f A_N^{(i)}(d) P_d(f) \prod_{v=1}^{w}\left(\frac{1}{vE_s/N_0 + 1}\right)^{f_v},$$

wherein $$P_d(f) = \prod_{v=1}^{w}\binom{M}{v}^{f_v}\left(\frac{L!}{f_0!f_1!\ldots f_w!}\right)/\binom{N}{d},$$

the length of the transmitted codeword is N, the codeword weight is d, and it is randomly mapped to the L blocks, M=N/L is defined as the length of each sub-block, and the weight of each sub-block is denoted as v, then the value range of v is 0≤v≤w, wherein w=min (M, d). $f_v$ denotes the number of sub-blocks with sub-block weight v, then the vector f=($f_0$, $f_1$, . . . , $f_w$)↔d, f represents the sub-block number vector corresponding to the sub-block weight distribution (0, 1, . . . , w) obtained after using the random interleaving mapping with the given codeword weight d. For example, $f_0$ represents the number of sub-blocks with sub-block weight 0, $f_1$ represents the number of sub-blocks with sub-block weight 1, and $f_w$ represents sub-blocks with sub-block weight w. F=L−$f_0$ represents the total number of sub-blocks with non-zero weight, and the upper bound of the number of sub-blocks with non-zero weight satisfies the following relationship:

$$F_v = \min\left\{F - \sum_{r=1}^{v-1} f_r, \frac{d - \sum_{r=1}^{v-1} rf_r}{v}\right\}, 1 \le v \le w,$$

wherein, r represents the sub-block weight, and 1≤ r≤ v−1 and $f_r$ represents the number of sub-blocks with sub-block weight r.

$$F - \sum_{r=1}^{v-1} f_r$$

represents the number of remaining sub-blocks after removing the number of sub-blocks with weight less than v.

$$\frac{d - \sum_{r=1}^{v-1} rf_r}{v}$$

means that after removing the Hamming weight corresponding to the number of sub-blocks with weight less than v from the total weight d, the remaining Hamming weight is assumed to be the weight contributed by the corresponding sub-blocks with weight v, that is, the number of sub-blocks with weight v, after removing the Hamming weight corresponding to the number of sub-blocks with weight less than v from the total weight d, into which the remaining Hamming weight may be divided. Both of these conditions should be met, so the minimum value is taken.

The second method is based on a combined sub-code polar weight spectrum. The combined sub-code polar weight spectrum is defined as {$A_N^{(i)}(d_1, \ldots, d_l, \ldots, d_L)$, 1≤l≤L, 1≤i≤N}, which represents the number of combinations of L sub-codewords with respective weights $d_1, \ldots, d_l, \ldots, d_L$. The combined sub-code polar weight spectrum may be abbreviated as $A_N^{(i)}(d_1^L)$. The combined sub-code polar weight spectrum also can be obtained through the second method that is used to calculate the polar weight spectrum for the polarized channel, that is, the combined sub-code polar weight spectrum corresponding to the code length 2N is obtained based on the combined sub-code polar weight spectrum corresponding to the code length N. It is assumed that the error probability of the i-th polarized channel of the polar code of a code length N is expressed as $P(W_N^{(i)})$, the signal-to-noise ratio of the fading channel is $E_s/N_0$, wherein $E_s$ represents the average energy for transmitting a single symbol of a signal, $N_0$ represents the noise power spectral density, then the upper bound of the error probability of the polarized channel may be derived from the distribution probability density of the fading factor as shown below:

$$P(W_N^{(i)}) \le \sum_{\sum_{l=1}^{L} d_l = d} \prod_{l=1}^{L} \frac{[A_N^{(i)}(d_1^L)]^{1/L}}{d_l \frac{E_s}{N_0} + 1} = \sum_{\sum_{l=1}^{L} d_l = d} A_N^{(i)}(d_1^L) \prod_{l=1}^{L} \frac{1}{d_l \frac{E_s}{N_0} + 1}.$$

Hereafter, the upper bound of error probability of each polarized channel is calculated under the conditions of three different fading channels based on the obtained polar weight spectrum, distribution probability density of the fading factor of the fading channel, and the signal-to-noise ratio of the fading channel.

At step 103, a logarithm of the calculated upper bound of the error probability for each polarized channel is taken and a reliability metric of the polarized channel is obtained based on the taken logarithm.

Specifically, after the upper bound of the error probability of each polarized channel is calculated, a logarithm of the calculated upper bound of the error probability for each polarized channel is taken, and then the taken logarithm is further processed to obtain a reliability metric of the polarized channel. Wherein the smaller the metric value is, the higher the reliability of the polarized channel is. Regarding the three different fading channels, a logarithm of the calculated upper bound of the error probability for each polarized channel is taken, which will be explained in details.

The first type of fading channel is the fast fading channel. The fast fading channel further includes a Rayleigh fast fading channel, a Rician fast fading channel, and a Nakagami-m fast fading channel.

Under the condition of the Rayleigh fast fading channel, a logarithm of the upper bound of the error probability of the polarized channel is taken and recorded as $UW_{Ray,1}^{(i)}$, wherein i represents the index of the polarized channel, i.e., $$UW_{Ray,1}^{(i)} = \ln\left[\frac{1}{2}\sum_d A_N^{(i)}(d)\left(1 + \frac{E_s}{N_0}\right)^{-d}\right] \propto \ln\left\{\sum_d \exp\left[\ln A_N^{(i)}(d) - d\ln\left(1 + \frac{E_s}{N_0}\right)\right]\right\}.$$

Under the condition of the Rician fast fading channel, a logarithm of the upper bound of the error probability of the polarized channel is taken and recorded as $UW_{Rician,1}^{(i)}$, wherein i represents the index of the polarized channel, i.e., $$UW_{Rician,1}^{(i)} = \ln\left[\frac{1}{2}\sum_d A_N^{(i)}(d)\left(\frac{1+K_{Rice}}{1+K_{Rice}+\frac{E_s}{N_0}}\right)^d \exp\left(-\frac{d\frac{E_s}{N_0}K_{Rice}}{1+K_{Rice}+\frac{E_s}{N_0}}\right)\right]$$

$$\propto \ln\left\{\sum_d \exp\left[\ln A_N^{(i)}(d) - d\ln\left(\frac{1+K_{Rice}+\frac{E_s}{N_0}}{1+K_{Rice}}\right) - \frac{d\frac{E_s}{N_0}K_{Rice}}{1+K_{Rice}+\frac{E_s}{N_0}}\right]\right\}$$

Under the condition of the Nakagami-m fast fading channel, a logarithm of the upper bound of the error probability of the polarized channel is taken and recorded as $UW_{Naka,1}^{(i)}$, wherein i represents the index of the polarized channel, i.e., $$UW_{Naka,1}^{(i)} =$$

$$\ln\left[\frac{1}{2}\sum_d A_N^{(i)}(d)\left(1+\frac{E_s}{mN_0}\right)^{-md}\right] \propto \ln\left\{\sum_d \exp\left[\ln A_N^{(i)}(d) - md\ln\left(1+1+\frac{E_s}{mN_0}\right)\right]\right\}.$$

The second type of fading channel is the overall block fading channel. Under the condition of the overall block fading channel, a logarithm of the upper bound of the error probability of the polarized channel is taken and recorded as $UW_{block,1}^{(i)}$, wherein i represents the index of the polarized channel, i.e., $$UW_{block,1}^{(i)} = \ln\left[\sum_d \frac{A_N^{(i)}(d)}{1+dE_s/N_0}\right] = \ln\left\{\sum_d \exp\left[\ln\frac{A_N^{(i)}(d)}{1+dE_s/N_0}\right]\right\}.$$

The third type of fading channel is the general fading channel. Under the condition of the general block fading channel, there are two methods to obtain the upper bound of the error probability of the polarized channel shown as follows.

The first method is based on a random mapping method, and a logarithm of the upper bound of the error probability of the polarized channel is taken and recorded as $UW_1^{(i)}$, wherein i represents the index of the polarized channel, i.e., $$UW_1^{(i)} = \ln\left[\sum_{d=d_{min}^{(i)}}^{N}\sum_f A_N^{(i)}(d)P_d(f)\prod_{v=1}^{w}\left(\frac{1}{vE_s/N_0+1}\right)^{f_v}\right] =$$

$$\ln\sum_{d=d_{min}^{(i)}}^{N}\sum_f \exp\left(\ln A_N^{(i)}(d) + \ln P_d(f) - \sum_{v=1}^{w} f_v \ln\left(v\frac{E_s}{N_0}+1\right)\right).$$

The second method is based on the combined sub-code polar weight spectrum method, a logarithm of the upper bound of the error probability of the polarized channel is taken and recorded as $UW_2^{(i)}$, wherein i represents the index of the polarized channel, i.e., $$UW_2^{(i)} = \ln\left[\sum_{\sum_{l=1}^{L} d_l = d} A_N^{(i)}(d_1^L) \prod_{l=1}^{L} \frac{1}{d_l \frac{E_l}{N_0} + 1}\right] = \ln\left\{\sum_{\sum_{l=1}^{L} d_l = d} \exp\left[\ln A_N^{(i)}(d_1^L) - \sum_{l=1}^{L} \ln\left(d_l \frac{E_s}{N_0} + 1\right)\right]\right\}.$$

In an embodiment of the present application, taking the logarithm of the calculated upper bound of the error probability for each polarized channel and obtaining reliability of the polarized channel based on the taken logarithm includes at least one of the following two methods.

In a method a, a logarithm of the calculated upper bound of the error probability for each polarized channel is taken, and the Jacobian transformation is performed on the taken logarithm to obtain a transformation result as a reliability metric of the polarized channel.

Specifically, the upper bound of the error probability may be calculated for each polarized channel, the logarithm of the calculated upper bound of the error probability is taken, and then the Jacobian transformation is performed to obtain a transformation result as the reliability metric of the polarized channel, wherein the smaller the reliability metric is, the higher the reliability of the polarized channel is. The Jacobian transformation after taking the logarithms for the three different fading channels will be described below in detail.

Under the condition of the Rayleigh fast fading channel in the first type of fast fading channel, the Jacobian transformation is performed on the taken logarithm to obtain $$UW_{Ray,1}^{(i)} \approx \max_d\left\{\ln A_N^{(i)}(d) - d\ln\frac{E_s}{N_0}\right\}.$$

Under the condition of the Rician fast fading channel, the Jacobian transformation is performed on the taken logarithm to obtain $$UW_{Rician,1}^{(i)} = \max_d\left\{\ln A_N^{(i)}(d) - d\ln\left(\frac{K_{Rice} + \frac{E_s}{N_0}}{1 + K_{Rice}}\right) - \frac{d\frac{E_s}{N_0}K_{Rice}}{K_{Rice} + \frac{E_s}{N_0}}\right\}.$$

Under the condition of the Nakagami-m fast fading channel, the Jacobian transformation is performed on the taken logarithm to obtain $$UW_{Naka,1}^{(i)} = \max_d\left\{\ln A_N^{(i)}(d) - m d\ln\frac{E_s}{N_0} + m d\ln m\right\}.$$

In the second type of overall block fading channel, the Jacobian transformation is performed on the taken logarithm to obtain $$UW_{block,1}^{(i)} = \max_d\left\{\ln A_N^{(i)}(d) - \ln\left(d\frac{E_s}{N_0}\right)\right\}.$$

In the third type of general block fading channel, the Jacobian transformation is performed on the taken logarithm obtained through the second method to obtain $$UW_2^{(i)} = \max_{d_1^L}\left\{\ln A_N^{(i)}(d_1^L) - \sum_{l=1}^{L}\ln d_l - \left(\ln\frac{E_s}{N_0}\right)^L\right\}.$$

$$\propto \max_{d_1^L}\left\{\ln A_N^{(i)}(d_1^L) - \sum_{l=1}^{L}\ln d_l\right\}$$

In a method b, when the signal-to-noise ratio is higher than a preset threshold, a logarithm of a first probability is taken for each polarized channel, and the taken logarithm is taken as the reliability metric of the polarized channel, wherein the first probability is an upper bound of the error probability of the polarized channel calculated approximately based on the polar weight spectrum corresponding to the minimum codeword weight.

Specifically, when the signal-to-noise ratio of the fading channel is higher than the preset threshold and reaches a high signal-to-noise ratio, the calculation of the reliability of the polarized channel in this case is mainly to approximately calculate the upper bound of the error probability of the polarized channel based on the polar weight spectrum corresponding to the minimum codeword weight. Therefore, a logarithm can be taken based on the calculated approximate upper bound of the error probability of the polarized channel, and then the taken logarithm may be used as the reliability metric of the polarized channel. When the signal-to-noise ratio is higher than a preset threshold, the logarithm of the approximate upper bound of the error probability of the polarized channel is taken, and the taken logarithm is used as the reliability metric of the polarized channel, which will be described in detail below for three types of fading channels.

Under the condition of the Rayleigh fast fading channel in the first type of fading channel, a logarithm of the approximate upper bound of the error probability of the polarized channel is taken, and the taken logarithm is taken as the reliability metric of the polarized channel to obtain $$UW_{Ray,2}^{(i)} = \ln A_N^{(i)}(d_{min}) - d_{min}\ln\frac{E_s}{N_0},$$

wherein $d_{min}$ represents the smallest codeword weight in the polar weight spectrum corresponding to the polarized channel.

Under the condition of the Rician fast fading channel, a logarithm of the approximate upper bound of the error probability of the polarized channel is taken, and the taken logarithm is taken as the reliability metric of the polarized channel to obtain $$UW_{Rician,2}^{(i)} = \ln A_N^{(i)}(d) - d\ln\left(\frac{K_{Rice} + \frac{E_s}{N_0}}{1 + K_{Rice}}\right) - \frac{d_{min}\frac{E_s}{N_0}K_{Rice}}{K_{Rice} + \frac{E_s}{N_0}},$$

wherein $d_{min}$ represents the smallest codeword weight in the polar weight spectrum corresponding to the polarized channel.

Under the condition of the Nakagami-m fast fading channel, a logarithm of the approximate upper bound of the error probability of the polarized channel is taken, and the taken logarithm is taken as the reliability metric of the polarized channel to obtain $$UW_{Naka,2}^{(i)} = \ln A_N^{(i)}(d_{min}) - md_{min}\ln\frac{E_s}{N_0} + md_{min}\ln m,$$

wherein $d_{min}$ represents the smallest codeword weight in the polar weight spectrum corresponding to the polarized channel.

Under the condition of the second overall block fading channel, a logarithm of the approximate upper bound of the error probability of the polarized channel is taken, and the taken logarithm is taken as the reliability metric of the polarized channel to obtain $$UW_{block,2}^{(i)} = \ln A_N^{(i)}(d_{min}) - \ln\left(d_{min}\frac{E_s}{N_0}\right),$$

wherein $d_{min}$ represents the smallest codeword weight in the polar weight spectrum corresponding to the polarized channel.

Under the condition of the third general block fading channel, a logarithm of the approximate upper bound of the error probability of the polarized channel obtained through the first method is taken, and the taken logarithm is taken as the reliability metric of the polarized channel to obtain $$UW_1^{(i)} = \max_{f, \sum_{v=1}^{w} vf_v = d_{min}^{(i)}} \left\{ \ln(A_N^{(i)}(d_{min}^{(i)})) + \sum_{v=1}^{w} f_v \ln\binom{M}{v} + \ln\left(\left(\frac{L!}{f_0!f_1!\ldots f_w!}\right) \bigg/ \binom{N}{d_{min}^{(i)}}\right) - \sum_{v=1}^{w} f_v \ln v \right\},$$

wherein $d_{min}^{(i)}$ represents the smallest codeword weight in the polar weight spectrum corresponding to the polarized channel with index i.

In an embodiment of the present application, the signal-to-noise ratio is a preset fixed value.

For example, under the condition of the Rayleigh fast fading channel, the signal-to-noise ratio is set as a fixed value, i.e., $$\frac{E_s}{N_0} = e,$$

to obtain $UW_{Ray,2}^{(i)} = \ln A_N^{(i)}(d_{min}) - d_{min}$, wherein $d_{min}$ represents the smallest codeword weight in the polar weight spectrum corresponding to the polarized channel.

Under the condition of the overall block fading channel, the signal-to-noise ratio is set as a fixed value, i.e., $$\frac{E_i}{N_0} = 1,$$

to obtain $$UW_{block,2}^{(i)} = \ln A_N^{(i)}(d_{min}) - \ln d_{min},$$

wherein $d_{min}$ represents the smallest codeword weight in the polar weight spectrum corresponding to the polarized channel.

At step 104, all polarized channels are sorted in an ascending order of the reliability metric and part of the polarized channels having a lowest reliability metric are selected for transmitting information bits and the remaining polarized channels for transmitting frozen bits.

Specifically, after the reliability metric is obtained for all polarized channels through the steps 101-103, all polarized channels are sorted in an ascending order of the reliability metric, part of polarized channels with the lowest reliability metric are selected for transmitting information bits and the remaining polarized channels are used for transmitting frozen bits.

By applying the embodiment of the present application, a polar code construction encoding is performed at a sending end, and then the information to be transmitted is transmitted through a fading channel, and then decoded by Successive Cancellation (SC) and Specifically, after the reliability metric is obtained for all polarized channels through the steps 101-103, all polarized channels are sorted in an ascending order of the reliability metric, part of polarized channels with the lowest reliability metric are selected for transmitting information bits and the remaining polarized channels are used for transmitting frozen bits.

By applying the embodiment of the present application, a polar code construction encoding is performed at a sending end, and then the information to be transmitted is transmitted through a fading channel, and then decoded by Successive Cancellation (SC) and Successive Cancellation List (SCL) algorithms at a receiving end. Compared the polar code construction by the GA algorithm, the polar code construction method according to the present application has better block error rate performance, that is, when the information to be transmitted is transmitted after applying the polar code construction method according to the present application, the information receiving end may obtain more complete information. The polar code construction method according to the present application with better block error rate performance is described in detail below in conjunction with FIG. 2 and FIG. 3.

Figure 2:
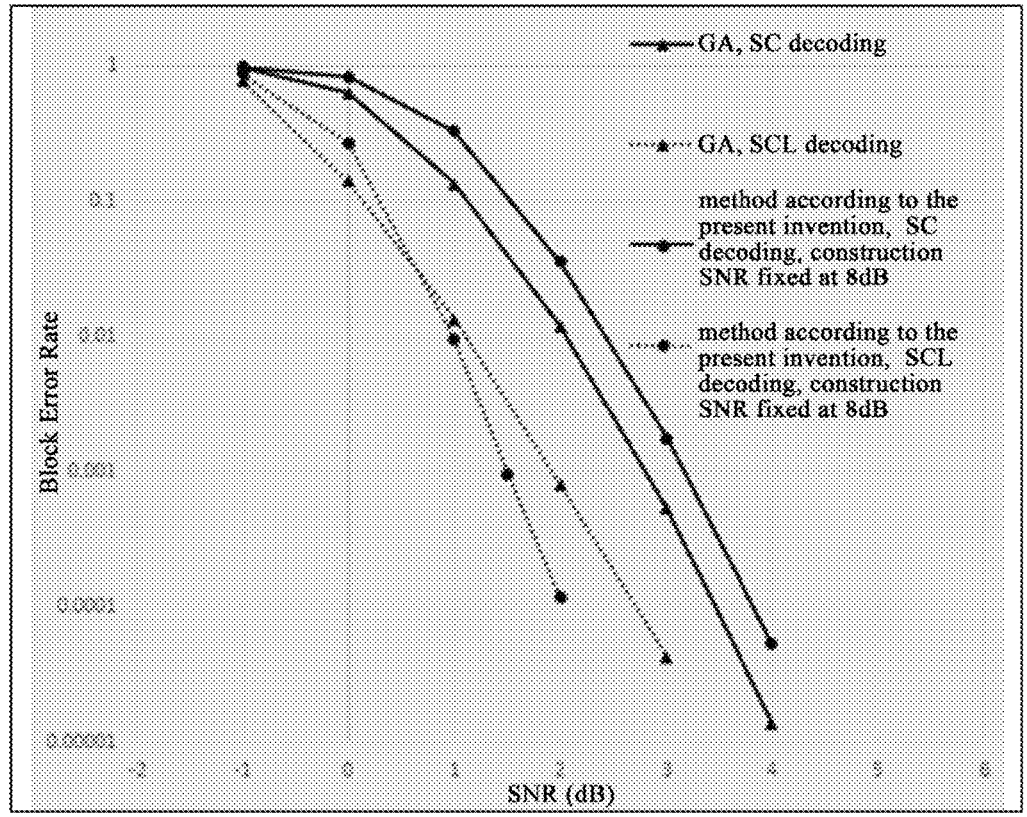
FIG. 2 is a schematic diagram of polylines for comparing experimental results according to an embodiment of the present application.

Refer to FIG. 2, which is a schematic diagram of polylines for comparing experimental results according to an embodiment of the present application. FIG. 2 shows simulation curves of the polar code block error rate when the code length is 1024 and the code rate is 0.5 under the condition of a Rayleigh fast fading channel. The GA algorithm and the method according to the present application are respectively used for performing polar code construction at the information sending end, wherein the signal-to-noise ratio for the construction in the method according to the present application takes a fixed value of 8 dB, and then the information to be transmitted is transmitted, and then SC and SCL algorithms are used to decode at the information receiving end. The horizontal axis represents the signal-to-noise ratio of the fading channel, and the vertical axis represents the block error rate. FIG. 2 includes 4 polylines including two solid lines and two dashed lines. Wherein, the two solid lines represent block error rates obtained by using the SC algorithm to decode the polar codes obtained by the above two construction methods, and the two dotted lines represent block error rates obtained by using the SCL algorithm to decode the polar codes obtained by the above two construction methods. It can be observed that the method according to the present application has better block error rate performance under the condition of the Rayleigh fast fading channel by using the SCL algorithm for decoding when the signal-to-noise ratio is greater than 1 dB.

For the Rayleigh fast fading channel, the polar code construction method according to the present application is based on the analysis of the error probability of the polarized channel, and the upper bound of the error probability of the polarized channel is obtained based on the polar weight spectrum, the polar weight spectrum reflects the codeword weight distribution characteristics of the polar code, also known as the distance spectrum characteristics. At the same time, the performance of SCL decoding is close to maximum likelihood decoding, the performance of which depends on the distance spectrum characteristics of the polar code. Since the polar code construction method according to the present application fully considers the codeword weight distribution characteristics of the polar code, better block error rate performance can be achieved under SCL decoding.

Figure 3:
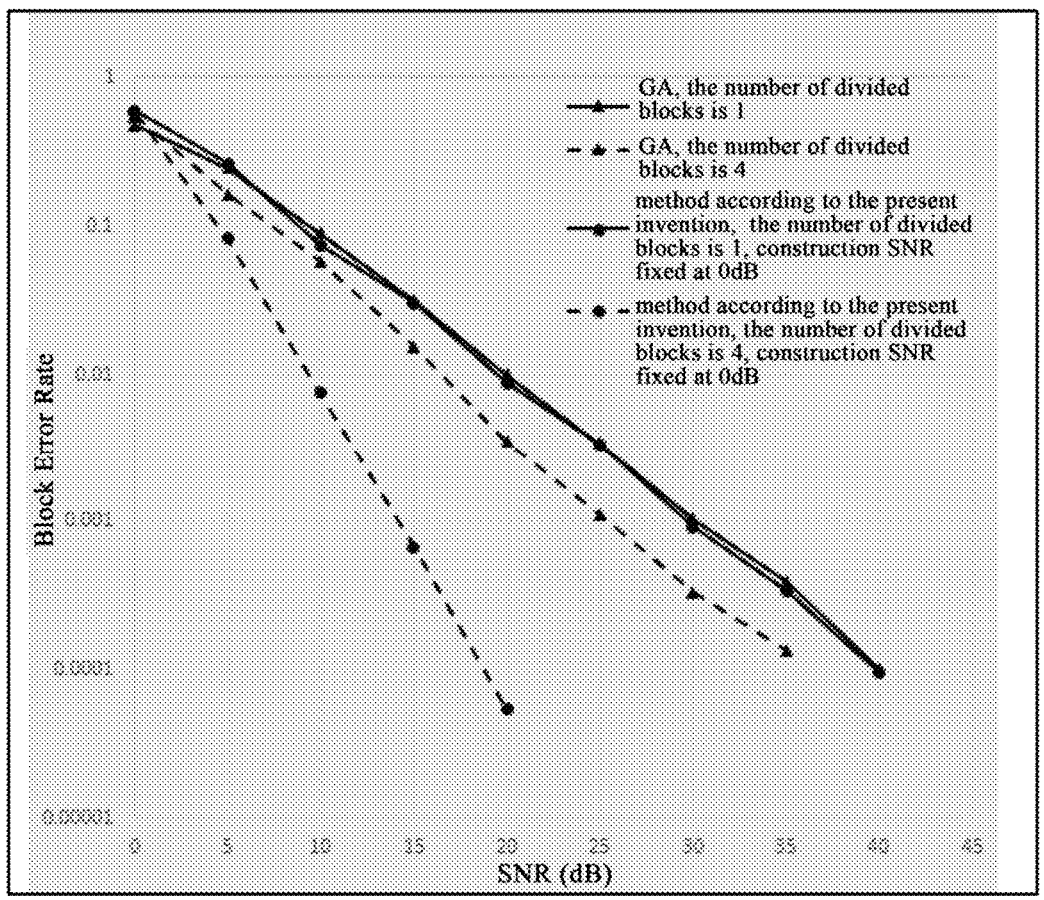
FIG. 3 is another schematic diagram of polylines for comparing experimental results according to an embodiment of the present application.

Refer to FIG. 3, which is another schematic diagram of polylines for comparing experimental results according to an embodiment of the present application. FIG. 3 shows simulation curves of the block error rate of the polar code when the code length is 512 and the code rate is 0.5 under the condition of a general block fading channel. When the number of divided blocks L is 1, it is equivalent to the overall block fading channel. The GA algorithm and the method according to the present application are respectively used for performing polar code construction at the information sending end, wherein the signal-to-noise ratio for construction in the method according to the present application takes a fixed value of 0 dB, and then the information to be transmitted is transmitted, and then SC algorithms is used to decode at the information receiving end. The horizontal axis represents the signal-to-noise ratio of the fading channel, and the vertical axis represents the block error rate. FIG. 3 includes 4 polylines including two solid lines and two dashed lines. Wherein, the two solid lines represent the block error rates obtained by using the SC algorithm to decode the polar codes obtained by the above two construction methods when L is 1, and the two dashed lines represent the block error rates obtained by using the SC algorithm to decode the polar codes obtained by the above two construction methods when L is 4. It can be observed that the method according to the present application has better block error rate performance under the condition of the general block fading channel (that is, the number of divided blocks L is 4) by using the SC algorithm for decoding.

The polar code construction method according to the present application can be applied to a general block fading channel, which fully considers the channel fading characteristics and the influence of the sub-block weight distribution when calculating the upper bound of the error probability of a polarized channel, while the GA algorithm is just a construction method designed for Additive White Gaussian Noise (AWGN) channel without considering the characteristics of the general block fading channel. Thus, the method according to the present application has better block error rate performance.

As can be seen, when the polar code is constructed using the method according to the embodiment under the condition of a fading channel, the upper bound of the error probability of each polarized channel is calculated by obtaining the polar weight spectrum for the polarized channel in conjunction with the distribution probability density of the fading factor of the fading channel and the signal-to-noise ratio of the fading channel, and then the logarithm of the upper bound of the error probability is taken, and then the reliability metric of each polarized channel is obtained based on the taken logarithm, and some polarized channels with the lowest reliability metric are selected for transmitting information bits. Those skilled in the art can understand that the polar code determines the bit positions used to transmit information bits according to the reliabilities of the polarized channels, that is to say, the reliability metric of each polarized channel can determine the bit position used to transmit information bits, to obtain the vector of information to be encoded, and then the encoded codewords of the polar code can be obtained based on the vector of information to be encoded and the generator matrix of the corresponding code length.

For example, for the polar code C(N,K), N is the code length, K is the information bit length, the corresponding vector of information to be encoded is a vector of 1×N, and each polarized channel corresponds to an element at a position in the vector of information to be encoded. Then, the top K polarized channels with the highest reliabilities may be determined based on the determined reliability metrics of the N polarized channels. The elements at respective positions in the vector of information to be encoded corresponding to the K polarized channels may be taken as 0 or 1, the other elements at respective positions in the vector of information to be encoded corresponding to the N–K polarized channels are taken as 0, and then the vector of information to be encoded is obtained. The vector of information to be encoded is set to $x_1^N$, and the generator matrix is $F_N$, then a codeword in the polar code C(N,K) is the product of the vector of information to be encoded and the generator matrix, namely $c_1^N = x_1^N \times F_N$.

The polar weight spectrum for each polar code of a code length may be calculated offline, and the reliability metric of the polarized channel is calculated based on the metric formula after the code length and the code rate are given. Thus, the efficiency of polar code construction is improved compared with the iterative calculation in the prior art.

Corresponding to the foregoing polar code construction method, an embodiment of the present application further provides a polar code construction apparatus.

Figure 4:
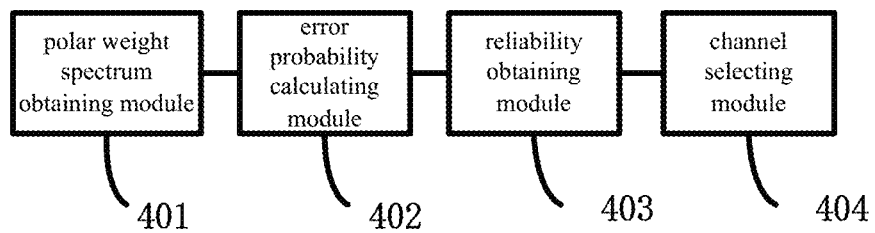
FIG. 4 is a schematic structural diagram of a polar code construction apparatus according to an embodiment of the present application.

Refer to FIG. 4, which is a schematic structural diagram of a polar code construction apparatus according to an embodiment of the present application. The apparatus includes:

a polar weight spectrum obtaining module 401 configured for obtaining a polar weight spectrum based on a code length of information to be transmitted;

an error probability calculating module 402 configured for calculating an upper bound of error probability of each polarized channel based on the obtained polar weight spectrum, distribution probability density of a fading factor of a fading channel, and a signal-to-noise ratio of the fading channel;

a reliability obtaining module 403 configured for taking a logarithm of the calculated upper bound of the error probability for each polarized channel and obtaining a reliability metric of the polarized channel based on the taken logarithm, wherein the smaller the metric value is, the higher the reliability of the polarized channel is;

a channel selecting module 404 configured for sorting all polarized channels in an ascending order of the reliability metric and selecting part of the polarized channels having a lowest reliability metric for transmitting information bits and the remaining polarized channels for transmitting frozen bits.

In an embodiment of the present application, the polar weight spectrum obtaining module includes:

a first polar weight spectrum obtaining unit, configured for obtaining a polar weight spectrum for a polar code of a code length N by enumerating codewords;

and/or a second polar weight spectrum obtaining unit, configured for obtaining a weight spectrum for the polar code of a code length N by enumerating codewords, and obtaining a weight spectrum for a polarized channel located on a lower half of a generator matrix of a polar code of a code length 2N based on a relationship between the generator matrix of the polar code of a code length 2N and a generator matrix of the polar code of a code length N; calculating a complete polar weight spectrum for the polar code of a code length 2N based on a Mac-Williams identity in the form of a matrix, and a relationship between the weight spectrum and the polar weight spectrum.

In an embodiment of the present application, the reliability obtaining module is specifically configured for:

taking the logarithm of the calculated upper bound of the error probability for each polarized channel, and performing Jacobian transformation on the taken logarithm to obtain a transformation result as the reliability metric of the polarized channel; or when the signal-to-noise ratio is higher than a preset threshold, taking a logarithm of a first probability for each polarized channel, and taking the taken logarithm as the reliability metric of the polarized channel, wherein the first probability is an approximate upper bound of the error probability of the polarized channel when only a minimum non-zero codeword weight is considered.

In an embodiment of the present application, the signal-to-noise ratio is a preset fixed value.

As can be seen, when the polar code is constructed using the method according to the embodiment of the present application under the condition of the fading channels, the upper bound of the error probability of each polarized channel is calculated by obtaining the polar weight spectrum for the polarized channel in conjunction with the distribution probability density of the fading factor of the fading channel and the signal-to-noise ratio of the fading channel, and then the logarithm of the upper bound of the error probability is taken, and then the reliability metric of each polarized channel is obtained based on the taken logarithm, and part of polarized channels with the lowest reliability metric are selected for transmitting information bits. The polar weight spectrum for each polar code of a code length may be calculated offline, and the reliability metric of the polarized channel is calculated based on the metric formula after the code length and the code rate are given. Thus, the efficiency of polar code construction is improved compared with the iterative calculation in the prior art.

Corresponding to the above polar code construction method, an embodiment of the present application further provides an electronic device.

Figure 5:
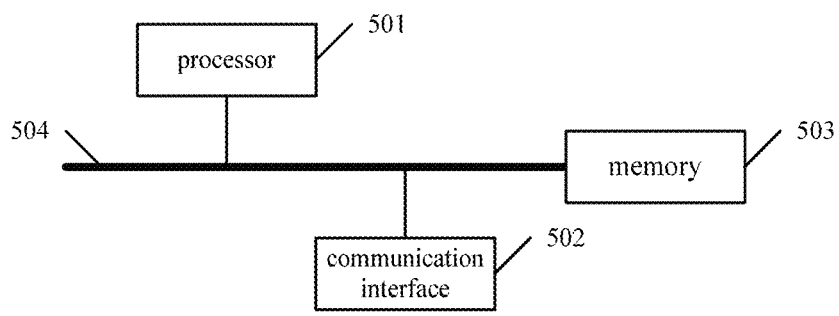
FIG. 5 is a schematic structural diagram of an electronic device according to an embodiment of the present application.

A schematic structural diagram of an electronic device is provided as shown in FIG. 5. The electronic device includes a processor 501, a communication interface 502, a memory 503, and a communication bus 504, wherein the processor 501, the communication interface 502 and the memory 503 communicate with each other through the communication bus 504;

the memory 503 is configured for storing computer programs;

the processor 501 is configured for implementing steps of the above method according to the above embodiments when executing the computer programs stored in the memory 503.

Corresponding to the above polar code construction method, an embodiment of present application further provides a computer-readable storage medium, having stored thereon computer programs that, upon execution by a processor, cause the implementation of the method steps of the above embodiments.

As can be seen, when the polar code is constructed using the method according to the embodiment of the present application under the condition of the fading channels, the upper bound of the error probability of each polarized channel is calculated by obtaining the polar weight spectrum for the polarized channel in conjunction with the distribution probability density of the fading factor of the fading channel and the signal-to-noise ratio of the fading channel, and then the logarithm of the upper bound of the error probability is taken, and then the reliability metric of each polarized channel is obtained based on the taken logarithm, and part of polarized channels with the lowest reliability metric are selected for transmitting information bits. The polar weight spectrum for each polar code of a code length may be calculated offline, and the reliability metric of the polarized channel is calculated based on the metric formula after the code length and the code rate are given. Thus, the efficiency of polar code construction is improved compared with the iterative calculation in the prior art.

The communication bus in the electronic device may be a Peripheral Component Interconnect (PCI) bus or an Extended Industry Standard Architecture (EISA) bus. The communication bus may be divided into an address bus, a data bus, a control bus, and the like. For convenience, the communication bus is only shown as one thick line in the figure, but it does not mean that there is only one bus or one type of bus.

The communication interface is used for communication between the electronic device and other devices.

The memory may include a Random Access Memory (RAM), and may also include a Non-Volatile Memory (NVM), such as at least one disk storage. Optionally, the memory may also be at least one storage device located away from the processor.

The processor may be a general-purpose processor, including a Central Processing Unit (CPU), a Network Processor (NP), etc.; or may be a Digital Signal Processing (DSP), an Application Specific Integrated Circuit (ASIC), a Field-Programmable Gate Array (FPGA) or other programmable logic device, discrete gate or transistor logic device, discrete hardware component.

Another embodiment of the present application further provides a computer-readable storage medium, having stored thereon computer programs that, when executed by a processor, cause the implementation of the steps of the polar code construction methods.

Another embodiment of the present application further provides a computer program product containing instructions that, upon executed on a computer, causes the computer to implement any polar code construction method in the above embodiments.

The above embodiments may be all or partially implemented by software, hardware, firmware, or any combination thereof. When implemented by software, it may be all or partly implemented in the form of a computer program product. The computer program product includes one or more computer instructions. When the computer program instructions are loaded and executed on a computer, the procedures or functions described in accordance with the embodiments of the present application will be realized in whole or in part. The computer may be a general purpose computer, a special purpose computer, a computer network, or other programmable device. The computer instructions may be stored on a computer-readable storage medium or transmitted from one computer-readable storage medium to another computer-readable storage medium, for example, the computer instructions may be transmitted from one website, computer, server, or data center to another website, computer, server, or data center via wired (e.g., coaxial cable, fiber optic, Digital Subscriber Line (DSL)) or wireless (e.g., infrared, wireless, microwave, etc.) means. The computer-readable storage medium may be any usable medium that can be accessed by a computer or comprise a data storage device, such as an integrated server, an integrated data center and the like that includes one or more usable media. The usable media may be a magnetic media (e.g., a floppy Disk, a hard Disk, a magnetic tape), an optical media (e.g., DVD), or a semiconductor media (e.g., a Solid State Disk (SSD)) and the like.

It should be noted that the relationship terms use here, such as "first," "second," and the like are only used to distinguish one entity or operation from another entity or operation, but do not necessarily require or imply that there is actual relationship or order between these entities or operations. Moreover, the terms "include," "comprise," or any variants thereof are intended to cover a non-exclusive inclusion, such that processes, methods, articles, or devices, including a series of elements, include not only those elements that have been listed, but also other elements that have not specifically been listed or the elements intrinsic to these processes, methods, articles, or devices. Without further limitations, elements limited by the sentences "comprise(s) a/an . . . " and "include(s) a/an . . . " do not exclude additional identical elements in the processes, methods, articles, or devices, including the listed elements.

Each embodiment in this specification is described in a related manner, and the same or similar parts between the various embodiments may be referred to each other. Each embodiment focuses on the differences from other embodiments. In particular, as for embodiments of apparatus, electronic device, computer-readable storage medium and computer program product, since they are basically similar to the method embodiment, the description is relatively simple, and the relevant part may refer to the description of the method embodiment.

The above descriptions are merely preferred embodiments of the present application, and are not intended to limit the present application. Any modification, equivalent substitutions, and improvements and the like made within the spirit and principle of this application fall within the protection scope of this application.

What is claimed is:

1. A polar code construction method executed by an electronic device comprising a processor, comprising:
    obtaining a polar weight spectrum based on a code length of information to be transmitted;
    calculating an upper bound of error probability of each polarized channel based on the obtained polar weight spectrum, distribution probability density of a fading factor of a fading channel, and a signal-to-noise ratio of the fading channel;
    taking a logarithm of the calculated upper bound of the error probability for each polarized channel and obtaining a reliability metric of the polarized channel based on the taken logarithm, wherein the smaller a value of the metric is, the higher a reliability of the polarized channel is;
    sorting all polarized channels in an ascending order of the reliability metric and selecting part of the polarized channels having a lowest reliability metric for transmitting information bits and remaining polarized channels for transmitting frozen bits,
    transmitting the information bits by the selected part of polarized channels, and transmitting the frozen bits by the remaining polarized channels.

2. The method according to claim 1, wherein obtaining the polar weight spectrum for each polarized channel comprises:
    obtaining a polar weight spectrum for a polar code of a code length N by enumerating codewords;
    and/or
    obtaining a weight spectrum for a polar code of a code length N by enumerating codewords, and obtaining a weight spectrum for a polarized channel located on a lower half of a generator matrix of a polar code of a code length 2N based on a relationship between the generator matrix of the polar code of a code length 2N and a generator matrix of the polar code of a code length N; calculating a complete polar weight spectrum for the polar code of a code length 2N based on a Mac-Williams identity in a form of a matrix, and a relationship between the weight spectrum and the polar weight spectrum.

3. The method according to claim 1, wherein taking the logarithm of the calculated upper bound of the error probability for each polarized channel and obtaining the reliability metric of the polarized channel based on the taken logarithm, comprises:
    taking the logarithm of the calculated upper bound of the error probability for each polarized channel, and performing Jacobian transformation on the taken logarithm to obtain a transformation result as the reliability metric of the polarized channel; or
    when the signal-to-noise ratio is higher than a preset threshold, taking a logarithm of a first probability for each polarized channel, and taking the taken logarithm as the reliability metric of the polarized channel, wherein the first probability is an approximate upper bound of the error probability of the polarized channel when only a minimum non-zero codeword weight is considered.

4. The method according to claim 1, wherein the signal-to-noise ratio is a preset fixed value.

5. The method according to claim 1, wherein calculating the upper bound of the error probability of each polarized channel based on the obtained polar weight spectrum, the distribution probability density of the fading factor of the fading channel, and the signal-to-noise ratio of the fading channel, comprises:

for a fast fading channel, an overall block fading channel and a general block fading channel, calculating the upper bound of the error probability of each polarized channel based on the obtained polar weight spectrum, the distribution probability density of the fading factor of each fading channel, and the signal-to-noise ratio of each fading channel by means of a preset error probability formula corresponding to each fading channel.

6. A non-transitory computer-readable storage medium, having stored thereon computer programs which, upon executed by a processor, cause the processor to implement steps of the method according to claim 1.

7. An electronic device, comprising a processor, a communication interface, a memory, and a communication bus, wherein the processor, the communication interface and the memory communicate with each other through the communication bus;

the memory is configured for storing computer programs;

the processor is configured for when executing the computer programs stored in the memory, performing the following operations of obtaining a polar weight spectrum based on a code length of information to be transmitted;

calculating an upper bound of error probability of each polarized channel based on the obtained polar weight spectrum, distribution probability density of a fading factor of a fading channel, and a signal-to-noise ratio of the fading channel;

taking a logarithm of the calculated upper bound of the error probability for each polarized channel and obtaining a reliability metric of the polarized channel based on the taken logarithm, wherein the smaller a value of the metric is, the higher a reliability of the polarized channel is;

sorting all polarized channels in an ascending order of the reliability metric and selecting part of the polarized channels having a lowest reliability metric for transmitting information bits and remaining polarized channels for transmitting frozen bits, transmitting the information bits by the selected part of polarized channels, and transmitting the frozen bits by the remaining polarized channels.

8. The electronic device according to claim 7, wherein the processor is further configured for:

obtaining a polar weight spectrum for a polar code of a code length N by enumerating codewords;

and/or obtaining a weight spectrum for a polar code of a code length N by enumerating codewords, and obtaining a weight spectrum for a polarized channel located on a lower half of a generator matrix of a polar code of a code length 2N based on a relationship between the generator matrix of the polar code of a code length 2N and a generator matrix of the polar code of a code length N; calculating a complete polar weight spectrum for the polar code of a code length 2N based on a Mac-Williams identity in a form of a matrix, and a relationship between the weight spectrum and the polar weight spectrum.

9. The electronic device according to claim 7, wherein the processor is further configured for:

taking the logarithm of the calculated upper bound of the error probability for each polarized channel, and performing Jacobian transformation on the taken logarithm to obtain a transformation result as the reliability metric of the polarized channel; or when the signal-to-noise ratio is higher than a preset threshold, taking a logarithm of a first probability for each polarized channel, and taking the taken logarithm as the reliability metric of the polarized channel, wherein the first probability is an approximate upper bound of the error probability of the polarized channel when only a minimum non-zero codeword weight is considered.

* * * * *